United States Patent [19]

DiMaria

[11] Patent Number: 4,471,471
[45] Date of Patent: Sep. 11, 1984

[54] NON-VOLATILE RAM DEVICE

[75] Inventor: Donelli J. DiMaria, Ossining, N.Y.

[73] Assignee: International Business Machines Corporation, Armonk, N.Y.

[21] Appl. No.: 336,463

[22] Filed: Dec. 31, 1981

[51] Int. Cl.$^3$ ............................................. G11C 11/24
[52] U.S. Cl. .................................. 365/149; 365/185; 357/23
[58] Field of Search .................. 357/23 VT, 54 R; 365/149, 182, 185

[56] References Cited

U.S. PATENT DOCUMENTS

| 3,387,286 | 6/1968 | Dennard | 365/222 |
|---|---|---|---|
| 3,676,717 | 7/1972 | Lockwood | 307/304 |
| 3,811,076 | 5/1974 | Smith, Jr. | 357/41 |
| 3,916,390 | 10/1975 | Chang et al. | 365/183 |
| 4,055,837 | 10/1977 | Stein et al. | 365/186 |
| 4,175,291 | 11/1979 | Spence | 365/184 |
| 4,207,615 | 6/1980 | Mar | 365/95 |
| 4,217,601 | 8/1980 | DeKeersmaecker et al. | 357/54 |
| 4,257,056 | 3/1981 | Shum | 357/23 VT |
| 4,363,110 | 12/1982 | Kalter et al. | 365/149 |
| 4,388,704 | 6/1983 | Bertin et al. | 365/185 X |
| 4,399,522 | 8/1983 | Kotecha | 365/185 |

OTHER PUBLICATIONS

D. J. DiMaria et al., "Electrically-Alterable Memory Using a Dual Electron Injector Structure", IEEE Electron Device Letters, vol. EDL-1, No. 9, Sep. 1980, pp. 179-181.

D. J. DiMaria et al., "High Current Injection into SiO$_2$ from Si Rich SiO$_2$ Films and Experimental Applications", Journal of Applied Physics, 51(5), May 1980, pp. 2722-2735.

Primary Examiner—Joseph A. Popek
Attorney, Agent, or Firm—Hansel L. McGee; Carl C. Kling

[57] ABSTRACT

Juxtaposing, on a common p-type substrate, an array of field effect transistor memory cells each including a random access memory dynamic RAM device comprising a floating gate portion and a storage node, and each including also a non-volatile unit comprising a double electron injector structure (DEIS) adjacent the floating gate portion, but remote from the storage node, provides a simple, low current dynamic random access memory array with non-volatile restart capability in case of power interruption.

The non-volatile unit in each memory cell shares the control gate and substrate in common with the dynamic RAM device and thus shares access to the floating gate but is remote from the storage node. Situated between the floating gate and the substrate is a silicon-rich DEIS stack. During normal operation, the device functions as a dynamic RAM device. When non-volatile storage is required, electrons are written into the floating gate by raising the voltage on the control gate. This injects electrons into an insulating layer in the DEIS; the electrons flow to the floating gate where they are stored indefinitely. Subsequent write and erase operations are carried out by applying an appropriately polarized voltage pulse to the control gate electrode, moving electrons with respect to the floating gate portion of the RAM device.

1 Claim, 8 Drawing Figures

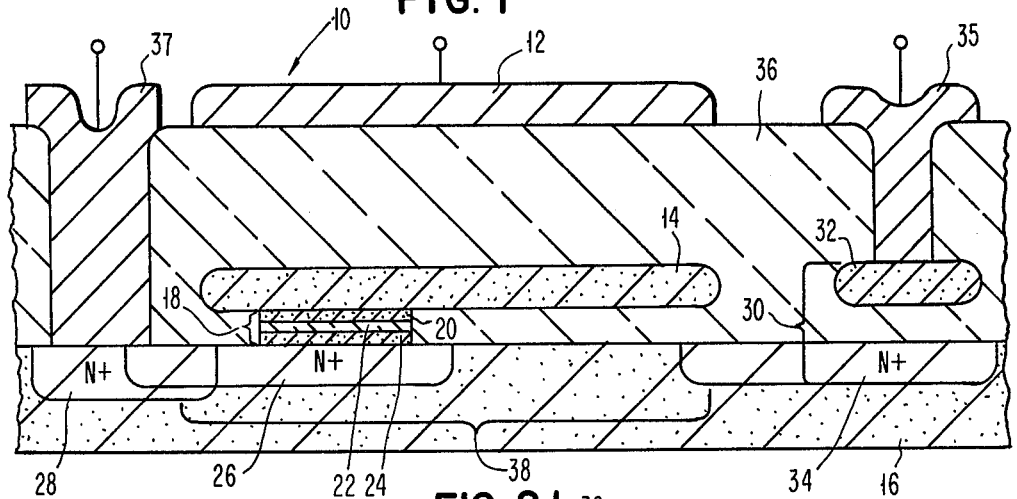
FIG. 1
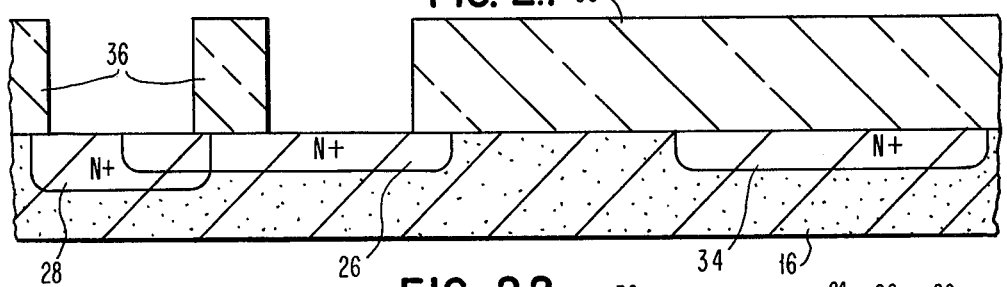
FIG. 2.1
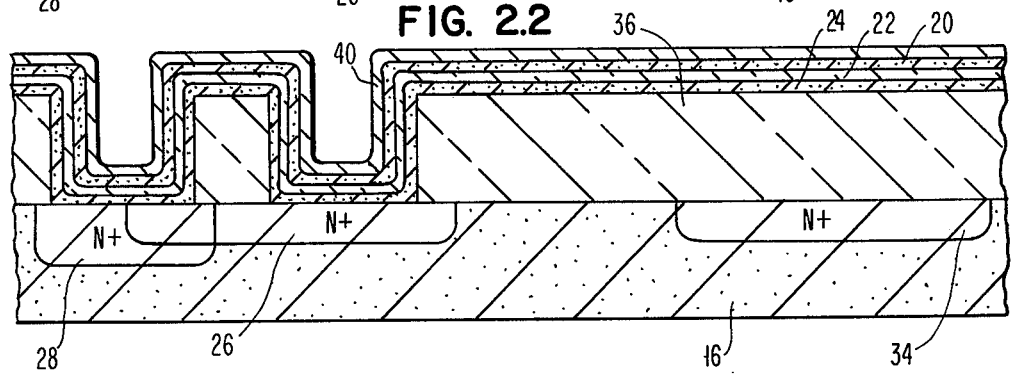
FIG. 2.2
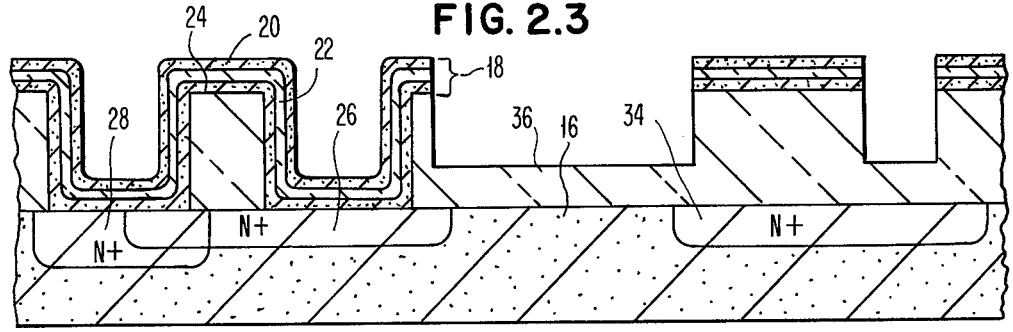
FIG. 2.3

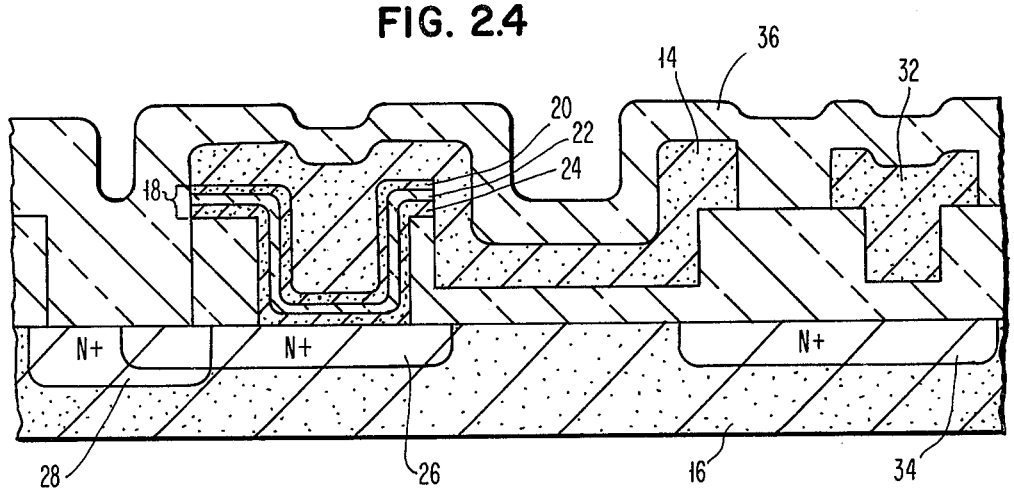
FIG. 2.4
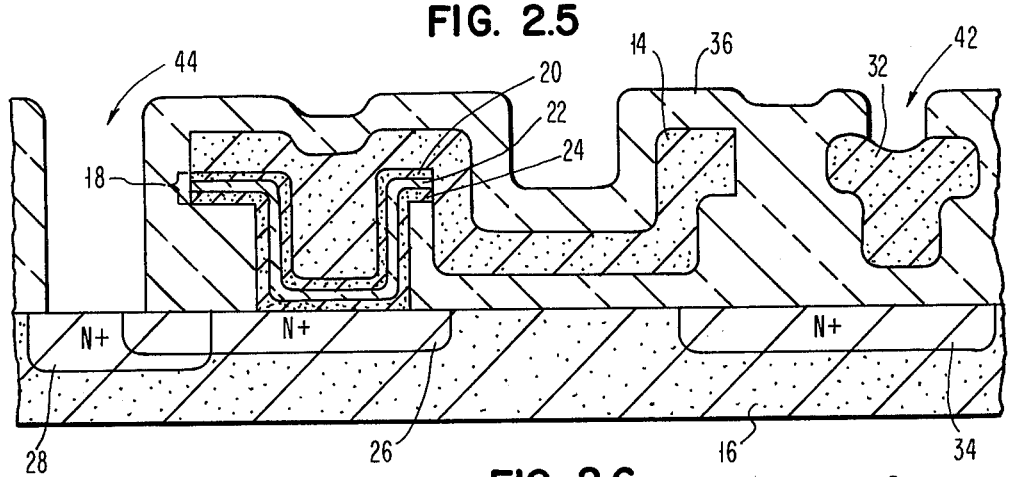
FIG. 2.5
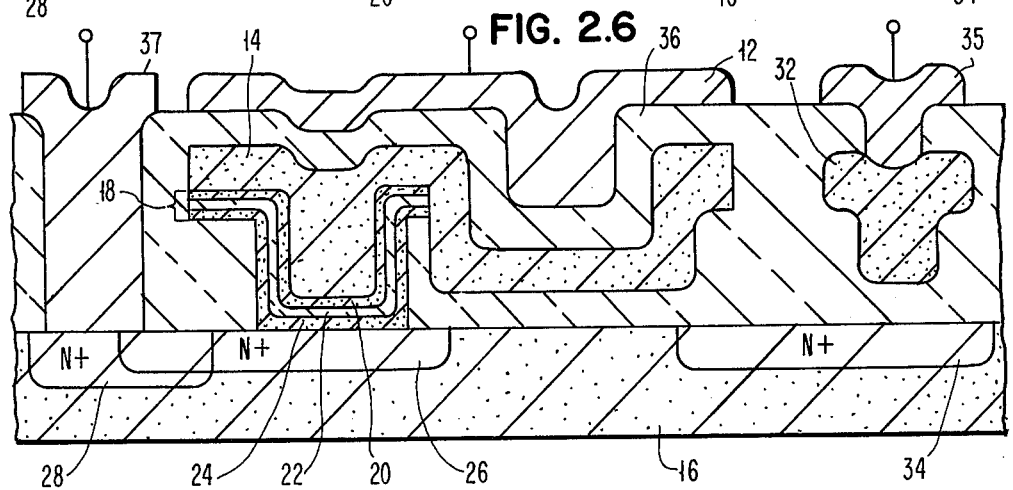
FIG. 2.6

NON-VOLATILE RAM DEVICE

DESCRIPTION

1. Technical Field

The U.S. Government has a paid-up license in this invention and the right in limited circumstances to require the patent owner to license others on reasonable terms as provided for by the terms of contract N. FI 9628-78-C-0225, awarded by Defense Advanced Research Projects Agency (DoD), DCASMA New York, 60 Hudson St., New York, N.Y. 10013.

This invention relates to non-volatile semiconductor memory devices, and more particularly to arrays of devices operating normally as volatile storage devices, and having floating gates for non-volatile data retention during power interruptions, and utilizing enhanced conduction insulators over the transfer gate to provide date recovery after resumption of power.

2. Background Art

There is need for non-volatile random access memories (NVRAM) in the electronic industry. So often when there is a power failure, information stored in present day random access memories is lost.

A number of circuits have evolved which take advantage of the ability of field effect transistors to store charge and thus serve as memory cells. Such cells may be either dynamic or static in nature. The dynamic cells may employ only a single field effect transistor and the static cells may be arranged in a flip-flop configuration, as is well known. Each of these types of cells may be referred to as volatile cells since information stored in these cells is lost when the power supply voltage applied to the memory is lost or turned off. In instances where stored volatile information must be retained, an alternate power supply, such as a battery system, must be coupled to the memory for use in the event of failure of the main power supply.

Known devices capable of providing variable threshold voltages, such as field effect transistors having metal-nitride-oxide-silicon (MNOS) and field effect transistors having a floating gate are capable of storing information in a non-volatile manner for long periods of time. By incorporating such non-volatile devices into memory cells, there has been provided normally operating volatile cells which do not require a backup or alternate power supply for preserving information when power interruption or failure occurs in the main power supply.

The non-volatile memory cells which use non-volatile MNOS transistors or devices are capable of retaining information for moderate periods of time stored volatilely in a cell but these devices require high voltage pulses for writing and erasing the information, they are slow and they require rather complex processes for their fabrication. An example of a non-volatile semiconductor memory cell is taught in U.S. Pat. No. 3,676,717, filed Nov. 2, 1970.

Known non-volatile memory cells which use conventionally arranged floating gate devices are also capable of preserving for long periods of time information stored volatilely in a cell but these devices likewise have required high voltage pulses for writing and erasing the information, they have been slow and required high currents, approximately one milliampere per device, to write. An example of a known non-volatile semiconductor memory cell having incorporated therein a floating gate is taught in U.S. Pat. No. 4,207,615, filed Nov. 17, 1978.

In commonly assigned U.S. patent application Ser. No. 192,579, filed on Sept. 30, 1980, by C. L. Bertin, H. N. Kotecha and F. W. Wiedman, now U.S. Pat. No. 4,388,704, there is disclosed non-volatile static memories which include a volatile circuit coupled to a non-volatile device, (akin to that of the present invention), having a floating gate and first and second control gates capacitively coupled to the floating gate with a charge injector structure including enhanced conduction insulators disposed between the floating gate and one of the two control gates.

A detailed discussion of enhanced conduction insulators may be found in an article entitled "High Current Injection into $SiO_2$ from Si Rich $SiO_2$ Films and Experimental Applications" by D. J. DiMaria and D. W. Dong, Journal of Applied Physics 51(5), May 1980, pp. 2722–2735, and a basic memory device which utilizes the dual electron injector structure is taught in an article entitled "Electrically-Alterable Memory Using a Dual Electron Injector Structure" by D. J. DiMaria, K. M. DeMeyer and D. W. Dong, IEEE Electron Device Letters, Vol. EDL-1, No. 9, September 1980, pp. 179–181.

Highly dense dynamic random access memory (RAM) cells having only a single storage capacitor and a single switch or transistor are disclosed in commonly assigned U.S. Pat. Nos. 3,387,286, filed on July 14, 1967, by R. H. Dennard and 3,811,076, filed on Jan. 2, 1973, by W. M. Smith.

One device dynamic volatile memory cells having the capability of storing data non-volatilely are known. For example, commonly assigned U.S. Pat. No. 3,916,390, filed Dec. 31, 1974, by J. J. Chang and R. A. Kenyon discloses the use of a dual insulator made of silicon dioxide and silicon nitride for storing information non-volatilely during power failure. Other examples of dynamic cells capable of storing information non-volatilely by using MNOS structures include U.S. Pat. Nos. 4,055,837, filed Oct. 22, 1975, by K. U. Stein et al and 4,175,291, filed Oct. 31, 1977, by W. Spence. These dynamic cells having non-volatile capability can operate satisfactorily, however, they generally require larger cell areas, larger voltages for the volatile operating mode or backup memory.

More recently, in application Ser. No. 219,285, now U.S. Pat. No. 4,363,110 to a common assignee, there is provided one such improved one device dynamic volatile memory cell having the capability of storing data non-volatilely. The device uses a floating gate for storing information non-volatilely during power failure and has a DEIS stack over the storage node for data recovery after power interruptions. To recover data after power has been restored, charge is transferred from the floating gate back to a storage node whereby the charge is partially depleted. In the most optimal case at ideal conditions the resultant charge is only 25% of the original stored charge. Therefore, in order to insure that the resultant signal is sufficiently large for sensing, the storage capacitance has to be at least 4 times larger than normal to insure a signal strong enough to be detected. Consequently large cell sizes are required.

DISCLOSURE OF THE INVENTION

It is an object of this invention to provide an improved dynamic random access memory device. It is another object of this invention to provide an improved dynamic random access memory device which can be used to provide non-volatile dynamic semiconductor memory arrays which are denser and more versatile than known memories.

It is another object of this invention to provide an improved dynamic random access memory device, preferably using an enhanced conduction or silicon rich insulator over the transfer gate for data recovery after resumption of power.

This invention provides improved dynamic random access memory devices. The device is a product of the merger of a state of the art dynamic random access memory (RAM), see reference to R. H. Dennard, with a dual electron-injector structure (DEIS) as described in the hereinabove cited IEEE Electron Device Letters article. The DEIS is situated in the FET gate portion of the dynamic RAM device. The floating gate FET is normally at a conductive state. During power failure, the floating gate FET is selectively charged or not charged with electrons via the DEIS according to whether a "1" or a "0" data valve is stored in the volatile memory device. When power returns, the data valve is retrieved by sensing whether the floating gate FET is in a conductive state or in a nonconductive state, which depends upon the presence or absence of the stored non-volatile charge on the floating gate. After data retrieval into the dynamic storage portion of the device, the non-volatile storage (floating gate) can be erased independently.

The foregoing and other objects, features and advantages of the invention will be apparent from the following and more particular description of the preferred embodiment of the invention, as illustrated in the accompanying drawings.

BRIEF DESCRIPTION OF THE DRAWINGS

FIG. 1 shows the non-volatile dynamic RAM device of the present invention.

FIGS. 2.1 to 2.6 show as an example a schematic of a method of fabricating the device of FIG. 1.

FIG. 1 shows the non-volatile dynamic RAM device of the present invention, generally designated 10. The non-volatile memory unit portion of each device comprises control gate 12, floating gate 14 and a p-type silicon substrate 16. Situated between floating gate 14 and substrate 16 is DEIS stack 18. This DEIS stack 18 comprises an insulator having a first Si rich region 20 and second Si rich region 24, separated by insulator 22. For the purposes of clarity the structures will be thought of as first and second Si rich SiO$_2$ regions separated by a silicon region. One skilled in the art would certainly know that other similar cermet type materials could also be used in place of the Si-rich SiO$_2$. The DEIS 18 is fabricated so as to be placed over the transfer gate, the first N+ diffusion region 26 in substrate 16. The N+ diffusion region 26 is connected to a second N+ source diffusion region 28. Source contact 37 is connected to the N+ region 28.

Figure 3:
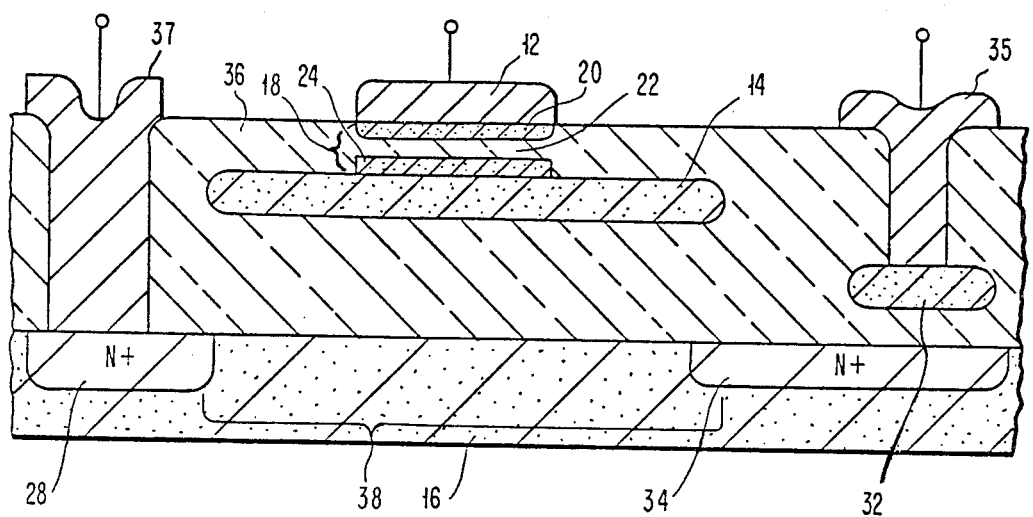
FIG. 3 shows an alternate embodiment, similar to that of FIG. 1.

The random access memory or RAM portion of the device comprises storage capacitor 30, which consists of plate 32 and a third N+ diffusion 34 (also known as a storage node) separated by insulator 36 FET switch 38 (transfer gate) is formed between source diffusion 28 and storage node 34, with control gate 12. Contact 35 is in contact with plate 32 of storage capacitor 30.

In normal operation the device of FIG. 1 functions as a dynamic RAM device. When non-volatile information storage is required, electrons are written onto floating gate 14, normally a doped polysilicon region, by raising the voltage on control gate 12 to a higher positive voltage than used for the normal mode of dynamic RAM operation. This operation turns on the second or lower Si rich region 24 of the DEIS 18, which via localized enhanced electric fields at the lower Si-rich SiO$_2$ region-insulator interface, injects electrons into the insulator layer 22. These electrons, due to the applied electrical field, flow to floating gate 14, where they are stored. These stored electrons can be erased by lowering the control gate potential to ground and by raising the potential of source region 26 to a positive voltage. When the electrons are erased, the first Si-rich SiO$_2$ injector 20 ejects electrons via localized enhanced electric fields at its interface with the intervening SiO$_2$ layer from floating gate 14 which flow therefrom to the N+ diffusion region 26.

Write and erase operations can be performed with voltages in the range from 5 V to 30 V in times from 5 msec to 5 nsec depending on the DEIS stack configuration and device geometry as discussed in the paper entitled, "Electrically-Alterable Read-Only-Memory Using Si-Rich SiO$_2$ Injectors and a Floating Polycrystalline Silicon Storage Layer", by D. J. DiMaria et al, which appeared in the Journal of Applied Physics, Vol. 52, pp. 4825-4842, July 1981.

FIGS. 2.1 to 2.6 show as an example a schematic of a method of fabricating the device in FIG. 1.

FIG. 2.1 provide P type substrate 16 having disposed therein N+ diffusion regions 26 and 28. An oxide layer 36 is grown atop substrate 16, it is delineated, and etched prior to diffusion and drive in of N+ diffusions 26 and 28. The N+ diffusion 34 is formed prior to oxide growth. In FIG. 2.2 the DEIS stack 18 is deposited and covered with a silicon nitride oxidation mask 40. The mask 40 is delineated and etched and oxide is regrown as shown in FIG. 2.3. The silicon nitride mask 40 is then removed by etching. A polysilicon film is then deposited, doped with an N+ type impurity, and delineated (FIG. 2.4). This polysilicon film thereby forms floating gate 14 and plate 32. A thick oxide layer is then deposited. The exposed portion of the DEIS stack 18 is converted to oxide during this step by the oxygen ambient. Then contact holes 42 and 44 are delineated and etched as shown in FIG. 2.5. Finally, metallization is effected for the formation of the control gate 12 and for contact to N+ source diffusion and dynamic RAM storage capacitor plate as shown in FIG. 2.6.

FIG. 3 shows an alternate embodiment, similar to that of FIG. 1, except that DEIS stack 18 is now situated between floating gate 14 and control gate 12, still over the transfer gate.

For this device, the write or erase operations for the non-volatile memory portion of the device are performed by applying a negative or positive voltage pulse to the control gate electrode, respectively. This will either put electrons on or take electrons off the floating gate portion of the device. The voltage range again can be from ±5 V to ±30 V with the switching times in the range from 5 msec to 5 nsec depending on the DEIS stack configuration and electrode geometry.

Having thus described my invention, what I claim as new, and desire to secure by Letters Patent is:

1. A dynamic random access memory array having a multiplicity of floating gate field effect transistor dynamic random access memory devices, said field effect transistor random access memory devices each having a control gate (12), a storage capacitor (30) with connected contact (35), a storage node (34), a floating gate (14) and a semiconductor substrate (36)

characterized by a multiplicity of non-volatile memory units, respectively associated one per dynamic random access memory device, each comprising a control gate (12), a floating gate (14) and a semiconductor substrate (36) in common with said dynamic random access memory device (13), and each further comprising a source diffusion region (28) with connected source contact (37) for sensing the floating gate (14) upon return of power, and a DEIS stack (18), to charge the floating gate (14), situated adjacent to the floating gate (14) portion of the respectively associated dynamic random access device, remote from its storage node (34), said source diffusion region (28) being separated from said storage node (34) by a field effect transistor switch (38).

* * * * *